United States Patent
Subramani et al.

(10) Patent No.: US 11,946,140 B2
(45) Date of Patent: Apr. 2, 2024

(54) HOT SHOWERHEAD

(71) Applicant: Applied Materials, Inc., Santa Clara, CA (US)

(72) Inventors: Anantha K. Subramani, Sunnyvale, CA (US); Seyyed Abdolreza Fazeli, Santa Clara, CA (US); Yang Guo, San Mateo, CA (US); Ramcharan Sundar, Bangalore (IN); Arun Kumar Kotrappa, Harihar (IN); Steven Mosbrucker, Santa Clara, CA (US); Steven D. Marcus, San Jose, CA (US); Xinhai Han, Santa Clara, CA (US); Kesong Hu, Pleasanton, CA (US); Tianyang Li, San Jose, CA (US); Philip A. Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 17/213,908

(22) Filed: Mar. 26, 2021

(65) Prior Publication Data

US 2022/0307131 A1    Sep. 29, 2022

(51) Int. Cl.
*C23C 16/455*    (2006.01)
*C23C 14/56*    (2006.01)
(Continued)

(52) U.S. Cl.
CPC ...... *C23C 16/45565* (2013.01); *C23C 14/564* (2013.01); *C23C 16/45536* (2013.01); *C23C 16/4586* (2013.01); *H01J 37/32082* (2013.01)

(58) Field of Classification Search
CPC .............. C23C 16/45565; H01J 37/32082
See application file for complete search history.

(56) References Cited

U.S. PATENT DOCUMENTS

| | | | | |
|---|---|---|---|---|
| 7,104,217 B2* | 9/2006 | Himori | ............ | H01J 37/32082 156/345.43 |
| 2001/0054381 A1* | 12/2001 | Umotoy | ............ | C23C 16/45514 118/725 |

(Continued)

FOREIGN PATENT DOCUMENTS

| | | |
|---|---|---|
| KR | 20180119024 A | 11/2018 |
| TW | 200727342 A | 7/2007 |
| WO | 2019033052 A1 | 2/2019 |

OTHER PUBLICATIONS

Application No. PCT/US2022/020569, International Search Report and Written Opinion, dated Jul. 6, 2022, 12 pages.

*Primary Examiner* — Aiden Lee
(74) *Attorney, Agent, or Firm* — Kilpatrick Townsend & Stockton LLP

(57) ABSTRACT

Exemplary substrate processing systems may include a chamber body defining a transfer region. The systems may include a first lid plate seated on the chamber body. The first lid plate may define a plurality of apertures through the first lid plate. The systems may include a plurality of lid stacks equal to a number of the plurality of apertures. The systems may define a plurality of isolators. An isolator may be positioned between each lid stack and a corresponding aperture of the plurality of apertures. The systems may include a plurality of annular spacers. An annular spacer of the plurality of annular spacers may be positioned between each isolator and a corresponding lid stack of the plurality of lids stacks. The systems may include a plurality of manifolds. A manifold may be seated within an interior of each annular spacer of the plurality of annular spacers.

18 Claims, 6 Drawing Sheets

(51) Int. Cl.
*C23C 16/458* (2006.01)
*H01J 37/32* (2006.01)

(56) References Cited

U.S. PATENT DOCUMENTS

| | | |
|---|---|---|
| 2006/0213438 A1 | 9/2006 | Ishizaka et al. |
| 2012/0097330 A1 | 4/2012 | Iyengar et al. |
| 2014/0103145 A1* | 4/2014 | White ............... H01J 37/32449 239/548 |
| 2014/0272184 A1* | 9/2014 | Sreekala ............... C23C 16/308 427/534 |
| 2019/0119816 A1* | 4/2019 | Zhang ................. C23C 16/4557 |
| 2019/0309419 A1* | 10/2019 | Baluja ............... C23C 16/45536 |
| 2020/0087788 A1* | 3/2020 | Tan ....................... C23C 16/509 |
| 2021/0013069 A1 | 1/2021 | Kalsekar et al. |

* cited by examiner

HOT SHOWERHEAD

TECHNICAL FIELD

The present technology relates to semiconductor processing equipment. More specifically, the present technology relates to semiconductor chamber components to provide fluid distribution.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Processing systems may use one or more components to distribute precursors or fluids into a processing region, which may improve uniformity of distribution. Some systems may provide distribution of multiple precursors or fluids for different processing operations, as well as for cleaning operations. Maintaining fluid isolation of materials while providing uniform distribution may be challenged in a number of systems, which may require incorporation of complex and expensive components.

Thus, there is a need for improved systems and components that can be used to produce high quality semiconductor devices. These and other needs are addressed by the present technology.

SUMMARY

Exemplary substrate processing systems may include a chamber body defining a transfer region. The substrate processing systems may include a first lid plate seated on the chamber body along a first surface of the first lid plate. The first lid plate may define a plurality of apertures through the first lid plate. The substrate processing systems may include a plurality of lid stacks equal to a number of apertures of the plurality of apertures defined through the first lid plate. The plurality of lid stacks may at least partially define a plurality of processing regions vertically offset from the transfer region. The substrate processing systems may include a plurality of isolators. An isolator of the plurality of isolators may be positioned between each lid stack of the plurality of lid stacks and a corresponding aperture of the plurality of apertures defined through the first lid plate. The substrate processing systems may include a plurality of annular spacers. An annular spacer of the plurality of annular spacers may be positioned between each isolator of the plurality of isolators and a corresponding lid stack of the plurality of lids stacks. The substrate processing systems may include a plurality of manifolds. A manifold of the plurality of manifolds may be seated within an interior of each annular spacer of the plurality of annular spacers.

In some embodiments, each lid stack of the plurality of lid stacks may include a faceplate spaced apart from a top surface of the manifold of the corresponding lid stack of the plurality of lids stacks. Each lid stack of the plurality of lid stacks may include a blocker plate spaced apart from a top surface of the manifold of the corresponding lid stack of the plurality of lids stacks. Each manifold of the plurality of manifolds may be characterized by a first surface facing a corresponding processing region of the plurality of processing regions and a second surface positioned opposite the first surface. The first surface and the second surface may include a conductive material. The substrate processing systems may include a plurality of radio frequency (RF) connections. An RF connection of the plurality of RF connections may be coupled with one of the manifolds of the plurality of manifolds.

Some embodiments of the present technology may encompass substrate processing chambers. The substrate processing chambers may include an isolator. The substrate processing chambers may include an annular spacer positioned atop the isolator. The substrate processing chambers may include a manifold seated atop the isolator and positioned within an interior of the annular spacer. A top surface of the manifold may be at a lower height than a top portion of the annular spacer. The manifold may define a plurality of apertures therethrough. The top surface of the manifold and a bottom surface of the manifold may include a conductive material.

In some embodiments, the substrate processing chambers may include a chamber body. The substrate processing chambers may include a lid plate seated atop the chamber body. The isolator may be seated atop the lid plate. A peripheral face of the manifold may be spaced apart from an inner surface of the annular spacer. The top surface of the manifold may include a smooth surface finish. The bottom surface of the manifold may include a textured emissivity pattern. The substrate processing chambers may include a faceplate seated atop the top surface of the annular spacer such that a gap is formed between a bottom surface of the faceplate and the top surface of the manifold. The annular spacer may include a base portion and an upper portion. An inner section of the upper portion may extend radially inward beyond an inner surface of the base portion. A peripheral edge of the manifold may be disposed beneath the upper portion of the annular spacer. The substrate processing chambers may include a plurality of pins positioned between the isolator and the manifold. The plurality of pins may elevate the bottom surface of the manifold above a top surface of the isolator. The substrate processing chambers may include a radio frequency (RF) connection that is coupled with the manifold. The RF connection may include an RF strap that couples the manifold and the annular spacer. The annular spacer may define a purge channel. The purge channel may be fluidly coupled with the RF connection.

Some embodiments of the present technology may encompass substrate processing chambers. The substrate processing chambers may include an isolator. The substrate processing chambers may include an annular spacer positioned atop the isolator. The substrate processing chambers may include a manifold seated atop the isolator and positioned within an interior of the annular spacer. A top surface of the manifold may be at a lower height than a top portion of the annular spacer.

In some embodiments, an inner portion of a bottom surface of the annular spacer may protrude below an outer portion of the bottom surface of the annular spacer such that a gap is formed between the outer portion of the bottom surface of the annular spacer and a top surface of the isolator. The manifold may include a dielectric core. The manifold may include a conductive outer surface. A bottom surface of the manifold may include a textured emissivity pattern having an emissivity of between or about 0.8 and 1.0. The manifold may include a conductive core. A bottom surface of the manifold may include a textured emissivity pattern having an emissivity of less than or about 0.5.

Such technology may provide numerous benefits over conventional systems and techniques. For example, a thermally floating manifold may enable higher processing chamber temperatures to be used without the risk of thermal creep or other deformities in lid stack components. Higher manifold temperatures may result in reduced residue build up on the manifold, fewer fall-on defects, quicker cleaning times, and higher deposition rates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
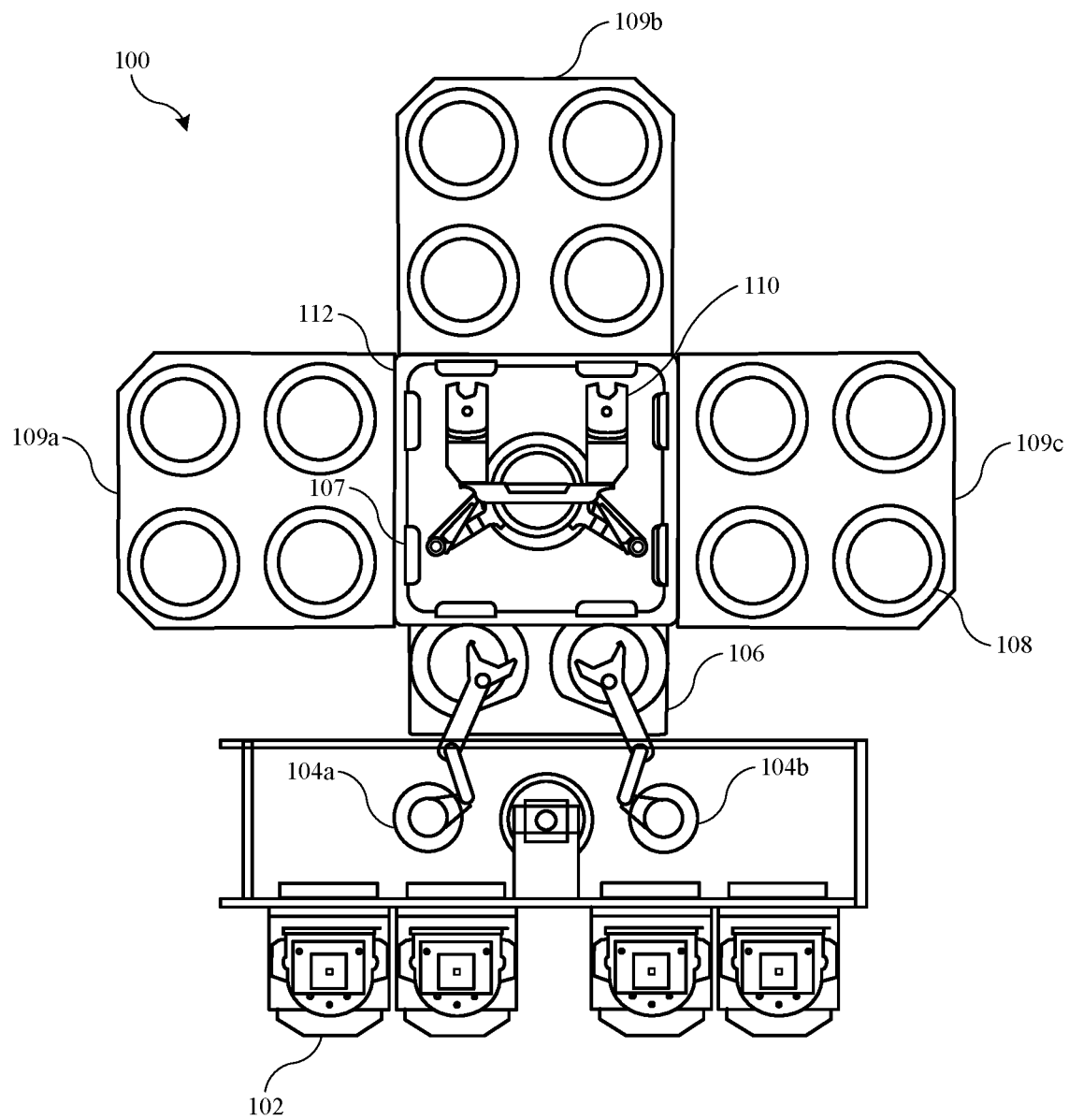
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

As additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. A substrate support may then vertically translate between the transfer region and the processing region to deliver a substrate for processing.

Each individual processing location may include a separate lid stack to provide improved and more uniform delivery of processing precursors into the separate processing regions. To improve delivery of one or more fluids or precursors through the lid stack, some embodiments of the present technology may include a thermally floating manifold positioned between the lid stack components and the processing chamber. By thermally floating the manifold, lid stack components above the manifold may be thermally isolated from processing chamber temperatures, which may enable higher in-chamber processing temperatures to be utilized without the risk of thermal creep or other deformities in lid stack components. This may provide several benefits. For example, higher processing chamber and manifold temperatures may result in reduced residue build up on the manifold, fewer fall-on defects, quicker cleaning times, and higher deposition rates.

Although the remaining disclosure will routinely identify specific structures, such as four-position transfer regions, for which the present structures and methods may be employed, it will be readily understood that the faceplates or components discussed may be equally employed in any number of other systems or chambers, as well as any other apparatus in which multiple components may be joined or coupled. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

Figure 1B:
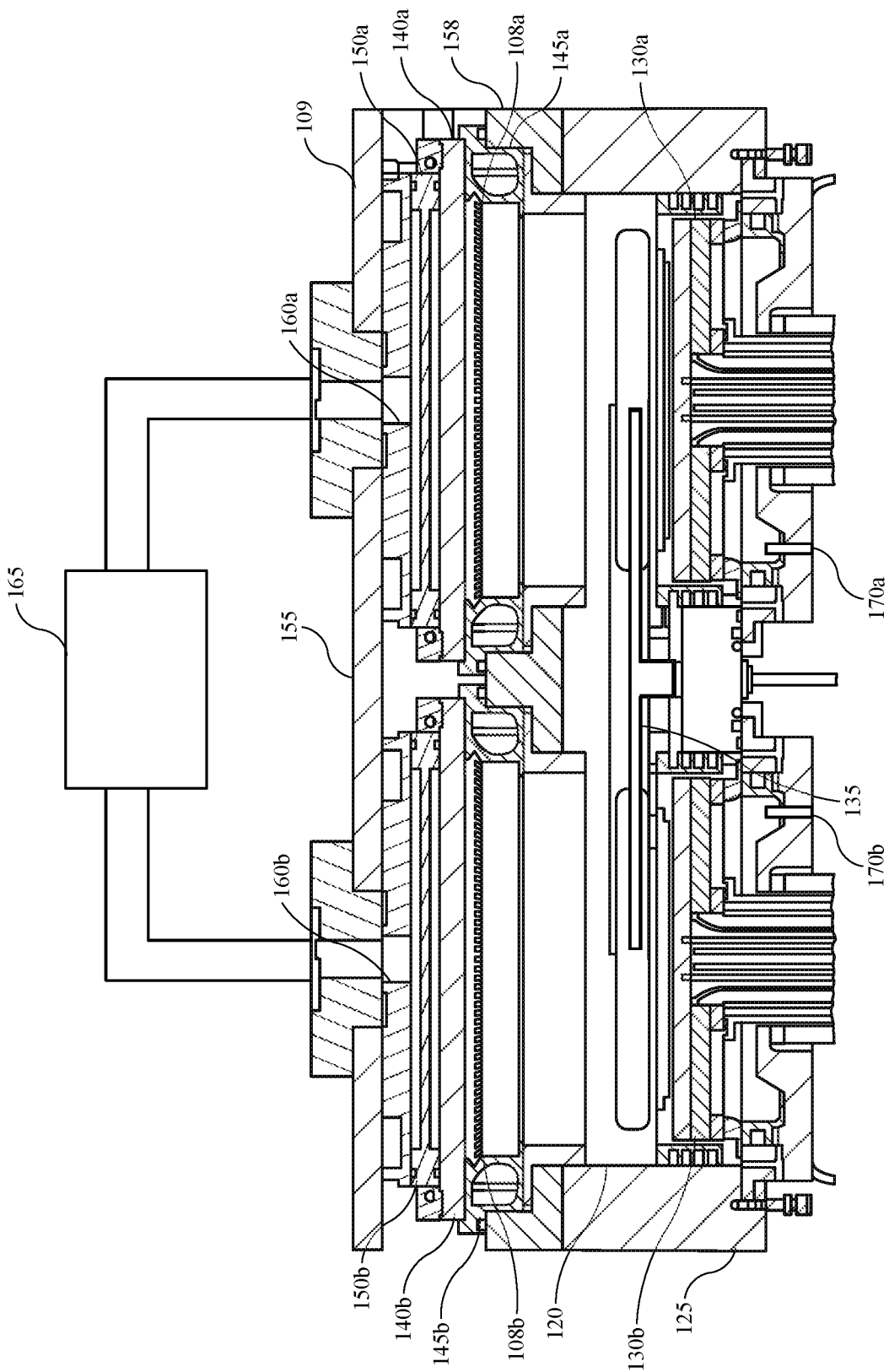
FIG. 1B shows a schematic partial cross-sectional view of an exemplary processing system according to some embodiments of the present technology.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
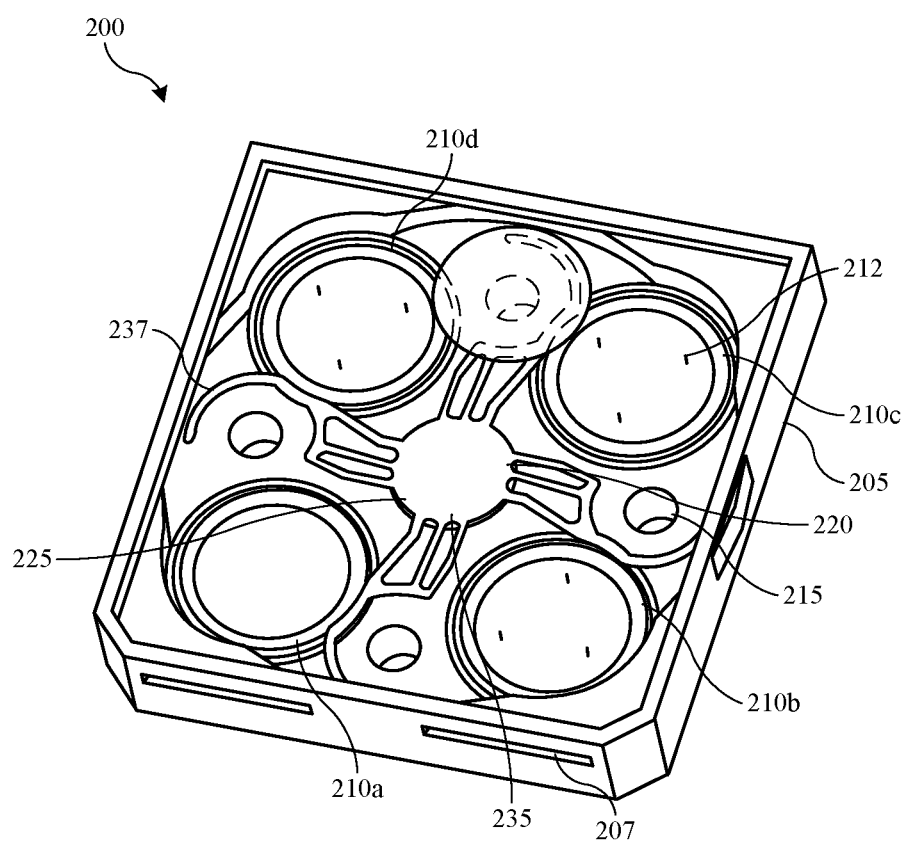
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210*a* or 210*b* through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210*a* and 210*b* to substrate supports 210*c* and 210*d*, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
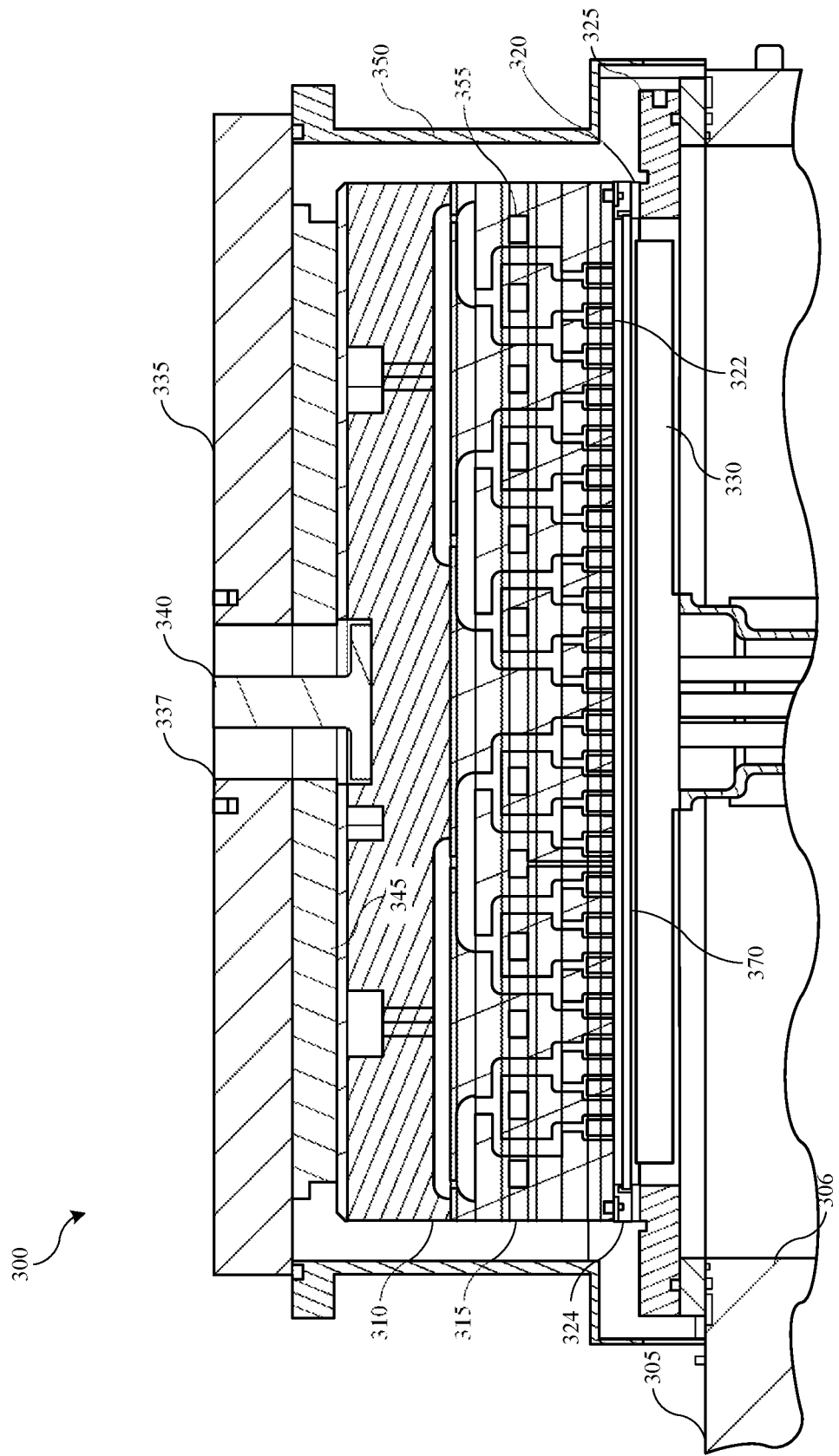
FIG. 3 shows a partial schematic cross-sectional view of an exemplary system arrangement of an exemplary substrate processing system according to some embodiments of the present technology.

FIG. 3 shows a schematic partial cross-sectional view of an exemplary processing system 300 arrangement of an exemplary substrate processing system according to some embodiments of the present technology. The figure may illustrate aspects of the processing systems and components described above, and may illustrate additional aspects of the system. The figure may illustrate an additional version of the system with a number of components removed or modified to facilitate illustration of fluid flow through the lid stack components. It is to be understood that processing system 300 may include any aspect of any portion of the processing systems described or illustrated elsewhere, and may illustrate aspects of a lid stack incorporated with any of the systems described elsewhere. For example, processing system 300 may illustrate a portion of a system overlying the transfer region of a chamber, and may show components positioned over a chamber body defining a transfer region as previously described. It is to be understood that any previously noted components may still be incorporated, such as including a transfer region and any component described previously for a system including the components of processing system 300.

As noted previously, multi-chamber systems may include individual lid stacks for each processing region. Processing system 300 may illustrate a view of one lid stack that may be part of a multi-chamber system including two, three, four, five, six, or more processing chamber sections. It is to be understood, however, that the described lid stack components may also be incorporated in standalone chambers as well. As described above, one or more lid plates may contain the individual lid stacks for each processing region. For example, as illustrated, processing system 300 may include a first lid plate 305, which may be or include any aspect of lid plate 158 described above. For example, first lid plate 305 may be a single lid plate that may be seated on the transfer region housing, or chamber body as previously described. The first lid plate 305 may be seated on the housing along a first surface of the lid plate. Lid plate 305 may define a plurality of apertures 306 through the lid plate allowing the vertical translation of substrates into the defined processing regions as previously described.

Seated on the first lid plate 305 may be a plurality of lid stacks 310 as previously described. In some embodiments, the first lid plate 305 may define a recessed ledge as previously illustrated extending from a second surface of the first lid plate 305 opposite the first surface. The recessed ledge may extend about each aperture 306 of the plurality of apertures. Each individual lid stack 310 may be seated on a separate recessed ledge, or may be seated over non-recessed apertures as illustrated. The plurality of lid stacks 310 may include a number of lid stacks equal to a number of apertures of the plurality of apertures defined through the first lid plate. The lid stacks may at least partially define a plurality of processing regions vertically offset from the transfer region as described above. Although one aperture 306 and one lid stack 310 are illustrated and will be discussed further below, it is to be understood that the processing system 300 may include any number of lid stacks having similar or previously discussed components incorporated with the system in embodiments encompassed by the present technology. The following description may apply to any number of lid stacks or system components.

The lid stacks may include any number of components in embodiments, and may include any of the components described above. Additionally, in some embodiments of the present technology, a faceplate 315 may be incorporated. The faceplate 315 may include a single plate or may include multiple plates, and may obviate some components of the lid stack in some embodiments. For example, a gasbox and blocker plate may be removed in some embodiments of the present technology. Faceplate 315 may be seated atop an isolator 320, which may electrically insulate the faceplate 315 from other chamber or housing components. One or more intervening components may be disposed between the faceplate 315 and the isolator in some embodiments. For example, an annular spacer 324 may be seated on a top surface of the isolator 320. The faceplate 315 may be seated atop a top surface of the annular spacer 324. System 300 may include a manifold 370, which may thermally isolate the faceplate 315 and/or other lid stack components from high temperatures used in processing region, as will be described further below. An additional spacer 325 may be included, although in some embodiments a pumping liner as previously discussed may be included in this position as well. A substrate may be seated on a pedestal 330, which may at least partially define the processing region with faceplate 315 and/or manifold 370.

Extending over the lid stacks 310 may be a second lid plate 335. Embodiments of the present technology may include a single second lid plate extending over all lid stacks, or may include individual second lid plates, each overlying a corresponding lid stack. Second lid plate 335 may extend fully over each lid stack of the processing system, and may provide access to the individual processing regions via a plurality of apertures defined through the second lid plate 335. Each aperture may provide fluid access to the individual lid stacks. Apertures defined through the second lid plates may include apertures providing delivery of one or more precursors, as well as apertures 337, which may provide access for an RF feedthrough 340. The RF feedthrough may facilitate operation of the faceplate 315 as a plasma-generating electrode within the system, which may allow plasma to be formed of one or more materials within the processing region. Because the faceplate may operate as a plasma-generating electrode, an insulator 345, made of any number of insulative or dielectric materials, may be positioned between the faceplate 315 and the second lid plate 335. In some embodiments a lid stack housing 350 may be included, which may operate as a heat exchanger for a fluid delivery about the lid stack, or which may otherwise extend about the lid stack.

Faceplate 315 may include a number of plates coupled together as will be described further below. The coupling may produce one or more flow paths through the faceplate. As illustrated, faceplates according to some embodiments of the present technology may define an interior volume 355, which may be formed between two or more plates. This volume may be utilized to provide an internal distribution region for one or more precursors or fluids, as will be explained in more detail below.

Figure 4:
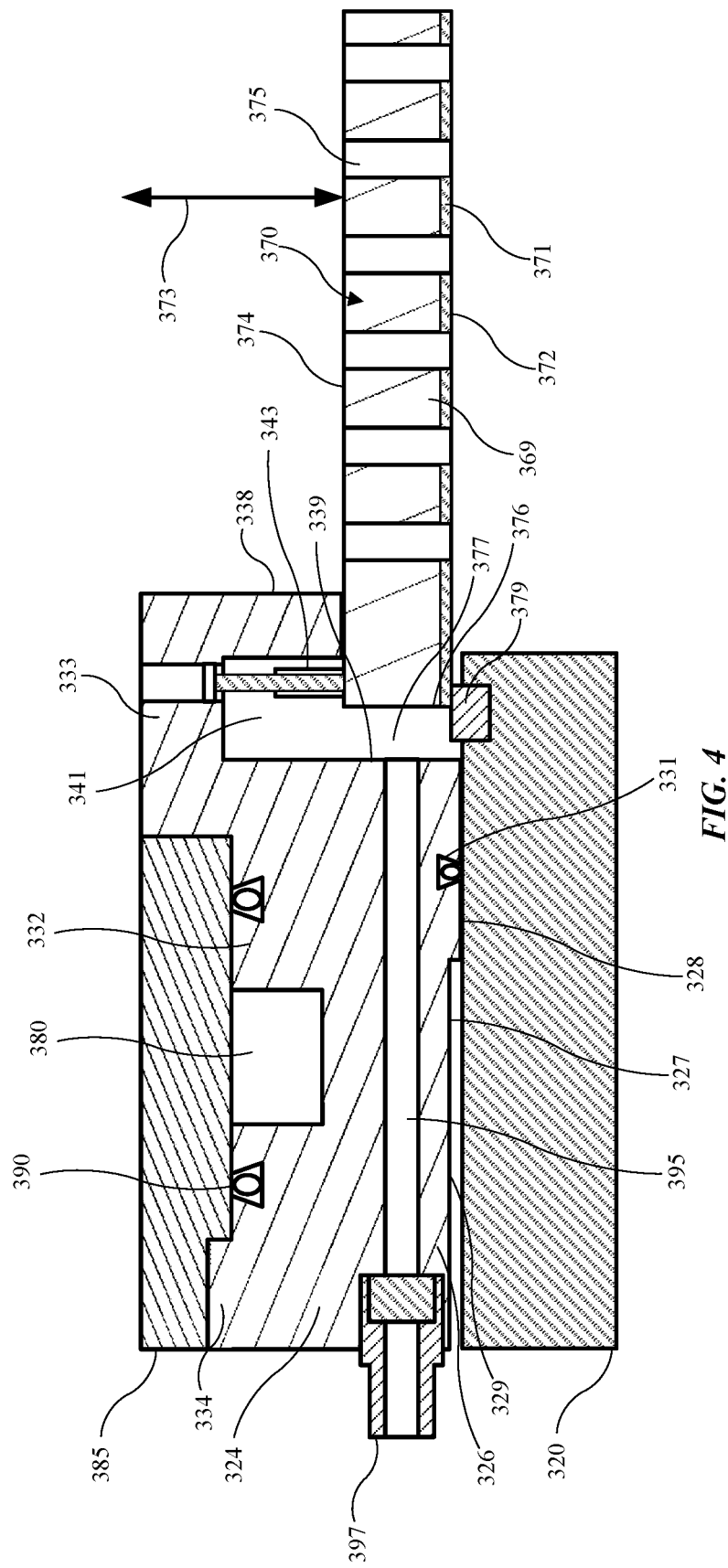
FIG. 4 shows a partial schematic cross-sectional view of an exemplary system arrangement of an exemplary substrate processing system according to some embodiments of the present technology.

FIG. 4 shows a schematic partial cross-sectional view of exemplary processing system 400 arrangement of an exemplary substrate processing system according to some embodiments of the present technology. The figure may have the same components as FIG. 3, and may include any of the features, components, or characteristics of any component or aspect of any system described previously. Although a single processing region and lid stack components are discussed, it is to be understood that the same or previously noted components may be included with any number of processing regions as discussed above. FIG. 4 may illustrate a more detailed view of the manifold 370 that may be incorporated with some embodiments of the present technology. One or more of the components previously described in any of the configurations may also be included. For example, a pedestal or substrate support may at least partially define a processing region with a faceplate 315, which may have any number of apertures or flow channels defined therethrough.

Isolator 320 may be seated atop a lid plate and/or a pumping liner as discussed above. The isolator 320 may be annularly shaped, with an inner diameter of the isolator 320 defining an open interior that may be at least partially aligned with the processing region. Manifold 370 may be seated on the isolator 320. For example, a peripheral edge of a bottom surface 372 of the manifold 370 may be seated atop an inner portion of the isolator 320 with a medial region of the manifold 370 being aligned with the open interior of the isolator 320. In some embodiments, the manifold 370 may be supported and/or elevated by a number of pins 379 that extend upward from a top surface of the isolator 320. For example, a number of pins 379 may be spaced at regular and/or irregular intervals about the top surface of the isolator 320. The pins 379 may help ensure proper alignment of the manifold 370. The bottom surface 372 may face the processing region, while a top surface 374 of the manifold 370 is positioned opposite the bottom surface 372. The manifold 370 may include a peripheral face 376 that extends between the top surface 374 and the bottom surface 372. The medial region of manifold 370 may define a plurality of apertures 375 that extend through a thickness of the manifold 370. The manifold 370 may include greater than or about 100 apertures 375, greater than or about 1,000 apertures 375, greater than or about 5,000 apertures 375, greater than or about 10,000 apertures 375, or more.

Top surface 374 and bottom surface 372 may include a conductive material. For example, the top surface 374 and bottom surface 372 may include a metal, such as aluminum. The aluminum may include aluminum 6061, RSA 905, and/or aluminum 6069 in some embodiments. In some embodiments, the entire manifold 370 may be formed from the conductive material, while in other embodiments, the top surface 374 and bottom surface 372 (and optionally the peripheral face 376) may include a conductive coating or layer. For example, a core 369 of the manifold 370 may be formed from a dielectric material, such as aluminum nitride, while the outer surfaces of the manifold 370 may include a conductive layer of material.

Annular spacer 324 may be seated on the isolator 320 at a position that is radially outward of the manifold 370. For example, annular spacer 324 may include a base portion 326 that includes a bottom surface 327. All or part of the bottom surface 327 may be positioned against the top surface of the isolator 320. For example, the bottom surface 327 may include an inner portion 328 and an outer portion 329. The inner portion 328 may protrude below the outer portion 329 such that a gap is formed between the outer portion 329 of the bottom surface 327 and the top surface of the isolator 320. Such an arrangement creates a standoff that helps isolate the annular spacer 324 from heat from the chamber, which may help reduce energy consumption and helps to prevent the lid stack components from heating up due to heat generated within the processing region. The inner portion 328 may define an annular channel 331 that may receive an O-ring, which may help seal an interface between the isolator 320 and the annular spacer 324.

Figure 5:
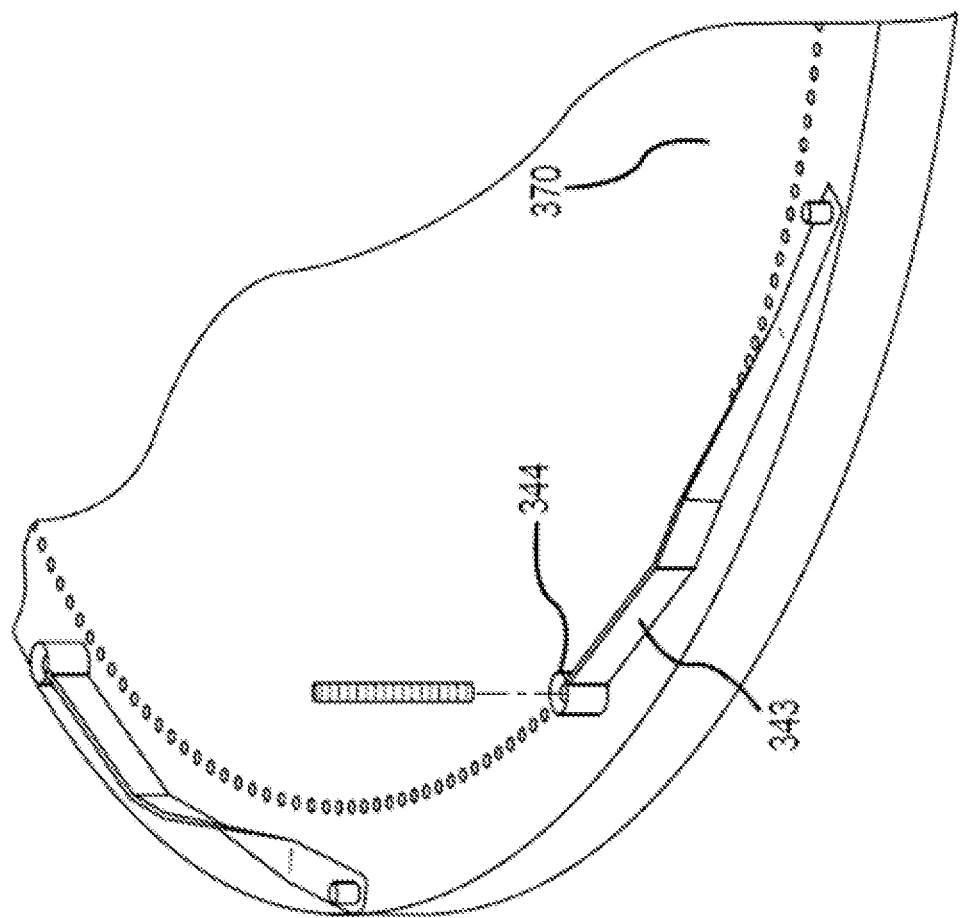
FIG. 5 shows a schematic isometric view of RF connections on a manifold according to some embodiments of the present technology.

Annular spacer 324 may include an upper portion 332 that extends upward from the base portion 326. The upper portion 332 of annular spacer 324 may include an inner section 333 and an outer section 334. Inner section 333 may extend radially inward from the base portion 326 and may extend over the peripheral edge of the manifold 370. The inner section 333 may include a downward-extending protrusion 338 that contacts a top surface of the manifold 370 at a position that is radially outward of the apertures 375. The protrusion 338 may secure the peripheral edge of the manifold 370 against the top surface of isolator 320. The protrusion 338 may be spaced apart from an inner surface 339 of a main body of the annular spacer 324 such that a gap 341 is formed between the protrusion 338 and the inner surface 339. The gap 341 may provide space for one or more RF connections. For example, a number of conductive RF straps 343 may be disposed within the gap 341. RF straps 343 may be formed from a conductive material, such as metal. In some embodiments, the metal may include aluminum. A number of RF straps 343 may be arranged about a periphery of the manifold 370 at regular and/or irregular angles. The RF straps 343 may be coupled with the manifold 370 and the annular spacer 324, and may be directly or indirectly coupled with the RF feedthroughs described above. This may enable the manifold to operate as a plasma-generating electrode within the system, which may allow plasma to be formed of one or more materials within the processing region. The RF straps 343 may be secured to the manifold 370 and the annular spacer 324 using one or more fasteners, such as bolts, screws, rivets, etc. For example, as shown in FIG. 5, the RF straps 343 may be riveted to the manifold 370 and may include threaded receptacles 344 that enable the RF straps 343 to be bolted or screwed to the annular spacer 324. The RF straps 343 may include thin, flat strips of conductive material that are arranged along an outer periphery of the manifold 370. The RF straps 343 may twist from a horizontal portion that is coupled to the manifold 370 to a vertically-oriented portion that defines or is coupled with the threaded receptacle 344. The RF straps 343 may be provided radially outward of the apertures 375.

Turning back to FIG. 4, all or a portion of the top surface of annular spacer 324 may be elevated relative to the top surface 374 of the manifold 370. For example, top surface of the inner section 333 may be elevated relative to the top surfaces of both the outer section 334 and the manifold 370. The topmost surface of the annular spacer 324 (as shown here, the top surface of the inner section 333) may support a number of lid stack components, such as a faceplate, a blocker plate, and/or a gasbox. For example, a faceplate or a blocker plate may be seated on the topmost surface of the annular spacer 324. The faceplate may have a number of apertures defined extending as exits from the faceplate as well, which may be the same or less than the number of apertures through the manifold 370. When the number of apertures of the two components is equal, the apertures may be axially aligned between the components to limit effects on fluid flow through the manifold 370, although any amount of offset may also be produced between apertures of the two components in some embodiments of the present technology.

By having the topmost surface of the annular spacer 324 be elevated relative to the top surface 374 of the manifold 370, the lid stack components, such as a faceplate and/or blocker plate may be spaced apart from the top surface 374 of the manifold 370. For example, a faceplate may be seated on the topmost surface of the annular spacer 324 such that a gap 373 is formed between the faceplate 315 and the manifold 370, which may thermally isolate the manifold 370 from faceplate 315 and the other lid stack components. The manifold 370 may be heated by the substrate support. By separating the manifold 370 from the faceplate 315 and other components, the manifold 370 may be thermally floated. This may enable heat from the substrate support to more uniformly heat the manifold 370, which may control heat loss from the component, and any impact on precursors being delivered. Thermally floating the manifold 370 may also enable higher chamber processing temperatures to be used, as heat from the chamber will be isolated from the lid stack components positioned above the floating manifold 370. For example, at substrate support temperatures of up to 550° C., the manifold 370 may reach temperatures of up to or about 300° C., up to or about 350° C., up to or about 400° C., or more, while lid stack components such as a faceplate and/or a blocker plate may remain at temperatures that are less than or about 200° C., less than or about 180° C., less than or about 160° C., or less. By maintaining the lid stack components at these cooler temperatures, the risk of thermal creep or other deformities occurring in the lid stack components may be reduced. The 373 gap between the manifold 370 and the faceplate (or other lid stack component) may be maintained to prevent plasma generation between the manifold 370 and the faceplate (or other lid stack component). In some embodiments, the gap distance may be less than or about 10 mm, and may be less than or about 8 mm, less than or about 5 mm, less than or about 4 mm, less than or about 3 mm, less than or about 2 mm, or less. By incorporating a floating manifold 370 in the system, degradation of the faceplate (or other lid stack component) may be limited or prevented in some embodiments. Additionally, by providing a conductive material on the top surface 374 of the manifold 370, it can be ensured that no electrical potential is formed within the gap 373.

To better thermally isolate lid stack components from heat from the chamber, the manifold 370 may include one or more emissivity textures on the top and/or bottom surfaces. For example, the top surface 374 may have a polished, smooth surface finish, which may help prevent heat from being emitted from the manifold 370 toward the upper lid stack components. The emissivity of the polished top surface 374 may be less than or about 0.2, less than or about 0.15, less than or about 0.1, less than or about 0.05, or less. The bottom surface 372 of the manifold 370 may include a textured emissivity pattern 371, which may emit heat back toward the substrate support. In embodiments in which the entire manifold 370 is formed from a conductive material, the emissivity of the bottom surface 372 may be less than or about 0.6, less than or about 0.55, less than or about 0.5, or less. In embodiments in which the manifold 370 includes a dielectric core and conductive top and bottom surfaces, the emissivity of the bottom surface 372 may be between or about 0.7 and 1.0, between 0.8 and 1.0, or between 0.9 and 1.0.

As illustrated, there may be a gap 377 formed between the peripheral face 376 of the manifold 370 and the inner surface 339 of the annular spacer 324. This gap 377 may help accommodate any thermal expansion of the manifold 370 as the manifold 370 increases in temperature due to processing operations within the processing region of the chamber. This gap 377 may be particularly useful when the manifold 370 is formed entirely of a conductor, such as aluminum. The gap 377 may be reduced and/or eliminated in embodiments in which the manifold 370 includes a dielectric core.

The outer section 334 of the annular spacer 324 may be generally aligned with the base portion 326 and may define a purge channel 380. Purge channel 380 may be an annular channel that extends entirely around the annular spacer 324. The purge channel 380 may have any cross-sectional shape and may have an open top. The open top may be closed off by a spacer 385 and/or other annular element that is positioned atop the outer section 334. A top surface of the outer section 334 may be recessed relative to the top surface of the inner section 333. The spacer 385 may be sized such that a top surface of the spacer 385 is aligned with the top surface of the inner section 333. This may enable upper lid stack components, such as faceplate 315, a blocker plate, and/or a gasbox to be seated on the top surfaces of the inner section 333 and the spacer 385. O-rings 390 and/or other seals may be provided on either lateral side of the purge channel 380 to seal the interface between the spacer 385 and the annular spacer 324. Purge channel 380 may be fluidly coupled with one or more purge gas sources, and may be fluidly coupled with the gap 377. This may enable purge gas, such as argon, to be flowed to the RF straps 343 to prevent any residue from forming on the RF straps 343 during processing operations.

The base portion 326 of the annular spacer 324 may include one or more temperature sampling ports 395, which may allow a temperature sensor 397, such as a pyrometer, to monitor a temperature of the manifold 370 in situ. For example, the temperature sampling port 395 may extend through a lateral thickness of the base portion 326 such that the temperature sensor can access the gap 373 and peripheral face 376 of the manifold 370.

While discussed above in conjunction with RF straps 343 that enable the manifold 370 to be RF bias to operate as a plasma-generating electrode, it will be appreciated that in some embodiments, the manifold 370 may be RF ground instead. For example, an RF gasket may be positioned between the isolator 320 and the bottom surface 372 of the manifold 370, which may eliminate the need for pins 379.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a plate" includes a plurality of such plates, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate processing system comprising:
   a chamber body defining a transfer region;
   a first lid plate seated on the chamber body along a first surface of the first lid plate, wherein the first lid plate defines a plurality of apertures through the first lid plate;
   a plurality of lid stacks, wherein a number of the plurality of lid stacks is equal to a number of apertures of the plurality of apertures defined through the first lid plate, wherein the plurality of lid stacks at least partially define a plurality of processing regions disposed above the transfer region;
   a plurality of isolators, wherein an isolator of the plurality of isolators is positioned between each lid stack of the plurality of lid stacks and a corresponding aperture of the plurality of apertures;
   a plurality of annular spacers, wherein an annular spacer of the plurality of annular spacers is positioned between each isolator of the plurality of isolators and a corresponding lid stack of the plurality of lids stacks; and
a plurality of manifolds, wherein a manifold of the plurality of manifolds is seated within an interior of each annular spacer of the plurality of annular spacers, wherein:
each annular spacer comprises a base portion and an upper portion that extends upward from the base portion;
the upper portion comprises an inner section and an outer section; and
the inner section comprises a downward-extending protrusion that contacts an upper surface of one of the plurality of manifolds.

2. The substrate processing system of claim 1, wherein:
each lid stack comprises a faceplate spaced apart from a top surface of the manifold of the plurality of manifolds.

3. The substrate processing system of claim 1, wherein:
each lid stack comprises a blocker plate spaced apart from a top surface of a manifold of the plurality of manifolds.

4. The substrate processing system of claim 1, wherein:
each manifold is characterized by a first surface facing a corresponding processing region of the plurality of processing regions and a second surface positioned opposite the first surface; and
the first surface and the second surface comprise a conductive material.

5. The substrate processing system of claim 1, further comprising:
a plurality of radio frequency (RF) connections, wherein an RF connection of the plurality of RF connections is coupled with one of the manifolds of the plurality of manifolds.

6. A substrate processing chamber, comprising:
an isolator;
an annular spacer positioned atop the isolator;
a manifold seated atop the isolator and positioned within an interior of the annular spacer, wherein:
a top surface of the manifold is at a lower height than a top portion of the annular spacer; and
the manifold defines a plurality of apertures therethrough; and
the top surface of the manifold and a bottom surface of the manifold comprise a conductive material; and
a plurality of pins positioned between the isolator and the manifold, wherein the plurality of pins elevate the bottom surface of the manifold above a top surface of the isolator such that a gap is formed between the bottom surface of the manifold and the top surface of the isolator.

7. The substrate processing chamber of claim 6, further comprising:
a chamber body; and
a lid plate seated atop the chamber body, wherein the isolator is seated atop the lid plate.

8. The substrate processing chamber of claim 6, wherein:
a peripheral face of the manifold is spaced apart from an inner surface of the annular spacer.

9. The substrate processing chamber of claim 6, wherein:
the top surface of the manifold comprises a smooth surface finish that has an emissivity of no greater than 0.2; and
the bottom surface of the manifold comprises a textured emissivity pattern that has an emissivity of no greater than 0.6 or between 0.7 and 1.0.

10. The substrate processing chamber of claim 6, further comprising:
a faceplate seated atop the top surface of the annular spacer such that a gap is formed between a bottom surface of the faceplate and the top surface of the manifold.

11. The substrate processing chamber of claim 6, wherein:
the annular spacer comprises a base portion and an upper portion;
an inner section of the upper portion extends radially inward beyond an inner surface of the base portion; and
a peripheral edge of the manifold is disposed beneath the upper portion of the annular spacer.

12. The substrate processing chamber of claim 6, further comprising:
a radio frequency (RF) connection that is coupled with the manifold.

13. The substrate processing chamber of claim 12, wherein:
the RF connection comprises an RF strap that couples the manifold and the annular spacer.

14. The substrate processing chamber of claim 12, wherein:
the annular spacer defines a purge channel; and
the purge channel is fluidly coupled with the RF connection.

15. A substrate processing chamber, comprising:
an isolator comprising an inner edge that defines an open interior, wherein the isolator comprises an electrically insulating material;
an annular spacer positioned atop the isolator, wherein:
an inner portion of a bottom surface of the annular spacer protrudes below an outer portion of the bottom surface of the annular spacer such that a gap is formed between the outer portion of the bottom surface of the annular spacer and a top surface of the isolator; and
an inner edge of the outer portion is disposed radially outward from the inner edge of the isolator; and
a manifold seated atop the isolator and positioned within an interior of the annular spacer, wherein a top surface of the manifold is at a lower height than a top portion of the annular spacer.

16. The substrate processing chamber of claim 15, wherein:
the manifold comprises a dielectric core; and
the manifold comprises a conductive outer surface.

17. The substrate processing chamber of claim 16, wherein:
a bottom surface of the manifold comprises a textured emissivity pattern having an emissivity of between 0.8 and 1.0, inclusive.

18. The substrate processing chamber of claim 15, wherein:
the manifold comprises a conductive core; and
a bottom surface of the manifold comprises a textured emissivity pattern having an emissivity of no greater than 0.5.

* * * * *